(12) United States Patent
Mancini et al.

(10) Patent No.: US 7,063,919 B2
(45) Date of Patent: Jun. 20, 2006

(54) LITHOGRAPHIC TEMPLATE HAVING A REPAIRED GAP DEFECT METHOD OF REPAIR AND USE

(76) Inventors: David P. Mancini, 15325 E. Palomino Blvd., Fountain Hills, AZ (US) 85268; William J. Dauksher, 4265 E. Hale St., Mesa, AZ (US) 85205; Kevin J. Nordquist, 4458 E. Olive Ave., Higley, AZ (US) 85236; Douglas J. Resnick, 216 W. Desert Flower La., Phoenix, AZ (US) 85045

(*) Notice: Subject to any disclaimer, the term of this patent is extended or adjusted under 35 U.S.C. 154(b) by 323 days.

(21) Appl. No.: 10/209,167

(22) Filed: Jul. 31, 2002

(65) Prior Publication Data

US 2004/0023126 A1 Feb. 5, 2004

(51) Int. Cl.
  *G03H 1/04* (2006.01)

(52) U.S. Cl. ............ 430/5; 430/311; 430/319; 430/320; 430/322

(58) Field of Classification Search .......... 430/5, 430/311, 319, 320, 322
See application file for complete search history.

(56) References Cited

U.S. PATENT DOCUMENTS

| 5,246,799 | A | * | 9/1993 | Pierrat ............... 430/322 |
| 5,246,801 | A | * | 9/1993 | Pierrat ............... 430/322 |
| 5,609,925 | A | | 3/1997 | Camilletti et al. |
| 6,387,787 | B1 | | 5/2002 | Mancini et al. |
| 2001/0028045 | A1 | | 10/2001 | Yang |

FOREIGN PATENT DOCUMENTS

WO   WO 81/03628   12/1981

\* cited by examiner

*Primary Examiner*—Geraldine Letscher (57) ABSTRACT

This invention relates to semiconductor devices, microelectronic devices, micro electro mechanical devices, microfluidic devices, and more particularly to an improved lithographic template including a repaired defect, a method of fabricating the improved lithographic template, a method for repairing defects present in the template, and a method for making semiconductor devices with the improved lithographic template. The lithographic template (10) is formed having a relief structure (26) and a repaired gap defect (36) within the relief structure (26). The template (10) is used in the fabrication of a semiconductor device (40) for affecting a pattern in device (40) by positioning the template (10) in close proximity to semiconductor device (40) having a radiation sensitive material formed thereon and applying a pressure to cause the radiation sensitive material to flow into the relief structure present on the template. Radiation is then applied through the template so as to further cure portions of the radiation sensitive material and further define the pattern in the radiation sensitive material. The template (10) is then removed to complete fabrication of semiconductor device (40).

41 Claims, 3 Drawing Sheets

LITHOGRAPHIC TEMPLATE HAVING A REPAIRED GAP DEFECT METHOD OF REPAIR AND USE

FIELD OF THE INVENTION

The present invention relates to semiconductor devices, microelectronic devices, micro-electro mechanical devices, photonic, optoelectronic, and microfluidic devices, and more particularly to a method of forming a lithographic template and repairing defects present in the lithographic template and a method for forming devices with the lithographic template.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned.

Lithographic processes such as that described above are typically used to transfer patterns from a photomask to a device. As feature sizes on semiconductor devices decrease into the submicron range, there is a need for new lithographic processes, or techniques, to pattern high-density semiconductor devices. Several new lithographic techniques which accomplish this need and have a basis in imprinting and stamping have been proposed. One in particular, Step and Flash Imprint Lithography (SFIL), has been shown to be capable of patterning lines as small as 20 nm.

Overall, SFIL techniques benefit from their unique use of photochemistry, ambient temperature processing, and the low contact pressure required to carry out the SFIL process. During a typical SFIL process, a substrate is coated with an organic planarization layer, and brought into close proximity of a transparent SFIL template, typically comprised of quartz, containing a relief structure and coated with a low surface energy material. A photocurable organic solution is deposited between the template and the coated substrate. Using minimal pressure, the template is brought into contact with the substrate, and more particularly the photocurable organic layer. Next, the organic layer is cured, or exposed, at room temperature by photoillumination through the template. The light source typically uses ultraviolet radiation, deep ultraviolet, or broad band radiation. A range of wavelengths (150 nm–500 nm) is possible, depending upon the transmissive properties of the template and photosensitivity of the photocurable organic. The template is next separated from the substrate and the organic layer, leaving behind an organic replica of the template relief on the planarization layer. This pattern is then etched with a short halogen break-through, followed by an oxygen reactive ion etch (RIE) through the planarization layer to form a high-resolution, high aspect-ratio feature in the organic layer and planarization layer.

The distinction between a lithographic mask and a lithographic template should be noted. A lithographic mask is used as a stencil to impart an aerial image of light into a photoresist material. A lithographic template has a relief structure formed into its surface, creating a form or mold. During SFIL, a pattern is defined when a photocurable liquid flows into the relief structure and is subsequently cured. During standard imprint lithography, a pattern is defined when a material present on the surface of a substrate material plastically deforms in response to pressure exerted thereupon by a patterned template. The attributes necessary for masks and templates, therefore are quite different.

One process of fabricating SFIL templates includes applying a layer of chrome, 15–100 nm thick, onto a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief structures in the quartz.

SFIL technology has been demonstrated to resolve features as small as 20 nm. As such, a wide variety of feature sizes may be drawn on a single wafer. Certain problems exist though with this SFIL template fabrication methodology. In particular, problems exist with the conventional resist, masking, and etch process, and defects formed on the relief surface of the template. More specifically, problems exist with respect to the number of required steps needed to fabricate the template, namely, the etching of the chrome, the etching of the quartz material, and the required etch and resist removal steps and defects that are present in the template relief surface subsequent to the etch process. It should be understood that each etching step increases the probability of defects and changes in feature dimension. These defects can be negative in nature, meaning there is an absence of relief material on the template relief surface, and are referred to herein as gap defects in that they define a "gap" in the relief material. Alternatively, these defects can be positive in nature, meaning there is extraneous relief material present on the template surface that does not define a desired portion of the relief structure. Defect repair, irrespective of negative or positive, is a critical requirement which must be addressed in SFIL.

In addition, there exist problems with respect to electron-beam writing of the template and the inspection of the template subsequent to fabrication. In particular, a charge dissipation layer must be present, in order to avoid charge build-up during electron-beam exposure. Inspectability is not readily achievable due to the template being comprised of a single homogeneous material. Typical inspection systems use either light (ultraviolet or deep ultraviolet) or electrons to determine feature size and detect unwanted defects on the template. Light-based systems require a difference in reflection or index of refraction between patterned and unpatterned areas of the template to provide good image contrast. Likewise, an electron-based system requires a difference in atomic number between patterned and unpatterned areas of the template. To overcome this problem, a template comprised of multiple materials having either different optical properties, electron scattering properties, or different atomic numbers would allow for inspection, a necessity for sub-100 nm features.

Accordingly, there is a need to simplify the fabrication process of forming SFIL templates. Specifically, it would be beneficial to provide for a template in which fewer processing steps are required to fabricate a template for use in SFIL technology, a means for repairing defects formed within the relief structure of the SFIL template, and a template in which inspection for sub-micron structures is achievable.

It is a purpose of the present invention to provide for an improved lithographic template including a repaired defect, a method of fabricating the improved lithographic template, a method for repairing defects present in the template, and a method for making semiconductor devices with the improved lithographic template in which minimal fabrication steps are utilized including a means for repairing defects formed within the relief structure of the SFIL template.

It is another purpose of the present invention to provide for an improved lithographic template including a repaired defect, a method of fabricating the improved lithographic template, a method for repairing defects present in the template, and a method for making semiconductor device with the improved lithographic template in which repair of defects formed on the template relief surface is obtainable.

It is still another purpose of the present invention to provide for an improved lithographic template, a method of fabricating the improved lithographic template, and a method for making semiconductor devices with the improved lithographic template in which improvement in the template and fabrication process provides for higher throughput and cost effectiveness.

SUMMARY OF THE INVENTION

This invention relates to semiconductor devices, microelectronic devices, micro electro mechanical devices, optoelectronic devices, photonic devices, microfluidic devices, and more particularly to a method of forming a lithographic template including a means for repairing gap defects present on the template surface, and a method for making semiconductor devices with the improved lithographic template. Disclosed is a lithographic template and a method of fabricating the template including a planar material which is able to form a relief structure by direct patterning. The template is formed by providing a substrate having an uppermost surface, forming a patterned relief layer supported by the substrate, and repairing any gap defects present within the patterned relief layer. Additionally, disclosed is a method for making a device with the lithographic template as provided, including the steps of providing a substrate, coating the substrate with a deformable material, providing a lithographic template as previously disclosed, positioning the lithographic template in contact with the deformable material, applying pressure to the template so that a pattern is created in the deformable material, optically transmitting radiation through the lithographic template to expose at least a portion of the deformable material on the substrate, thereby further affecting the pattern in the deformable material, and removing the template from the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

It will be appreciated that for simplicity and clarity of illustration, elements illustrated in the drawings have not necessarily been drawn to scale. For example, the dimensions of some of the elements are exaggerated relative to other elements for purposes of clarity. Furthermore, where considered appropriate, reference numerals have been repeated among the drawings to indicate corresponding or analogous elements.

DESCRIPTION OF THE PREFERRED EMBODIMENT

The present invention relates to the improvement of a template that will be able to utilize known photomask handling equipment, such as cleaning and inspection equipment, yet still allow for a template appropriate for use in standard imprint lithography as well as SFIL for producing patterns in semiconductor devices. Since in the course of fabricating a template, a patterned relief layer must be formed, it is necessary to make a distinction between the various methods of forming this layer. In general, in conventional template patterning, any layer which is to be patterned is first deposited uniformly on a substrate by some means such as spin coating or deposition from a vapor phase. A layer of an imageable material (resist), typically a photon or e-beam sensitive polymer is next applied to this surface and patterned using optical or e-beam methods which are well know in the art of lithography. A pattern is formed following a development process which preferentially removes material from the resist layer forming a pattern. The resist layer is used as a mask to transfer its pattern to the layer underneath via etching using wet or dry methods. Finally, the resist layer is removed as it is no longer needed, with the pattern now residing in the template's uppermost relief layer. During this process any number of gap defects can be formed within the uppermost relief layer. Provided herein is a template and method of forming the template in which these gap defects are repaired using a material which is patternable to fill in the defect.

Disclosed herein is a method of using a directly patternable spin coatable oxide to repair gap defects on SFIL templates. This is made possible by judicious use of unique materials which combine the patternable characteristics of an organic photoresist, with the robust mechanical properties of an inorganic oxide. These two characteristics combine to provide the necessary attributes of a gap repairing material. These attributes include high adhesive strength to the relief layer, high modulus, high shear strength, and good thermal stability. Materials such as hydrogen silsesquioxane (HSQ) are patternable to a very high resolution and, once cured, form a very stable silicon oxide suitable as a template relief structure for imprinting. Materials with similar characteristics may be substituted for this application for HSQ. However, it should be noted that any such materials which are both irradiation sensitive and patternable, and possess adequate physical properties to behave as a part of the repaired defect are unique and are the heart of this invention.

Figure 1:
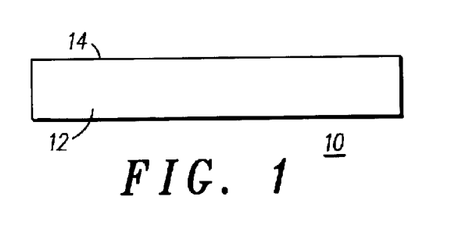
FIGS. 1–10 illustrate in cross-section views, process steps for fabricating a first embodiment of a lithographic template in accordance with the present invention.

Referring to FIGS. 1–10, illustrated in cross-sectional views, are a plurality of process steps for fabricating a first embodiment of a lithographic template according to the present invention. Referring now to FIG. 1, illustrated is a first step in the process of fabricating a lithographic template 10 according to the present invention. Illustrated is substrate 12, having a surface 14. Substrate 12 is disclosed as being comprised of a transparent or semi-transparent homogeneous material, such as a quartz material, a polycarbonate material, a pyrex material, a calcium fluoride ($CaF_2$) material, a magnesium fluoride material ($MgF_2$), or any other similar type of material, that is transparent or semi-transparent to light.

Figure 2:
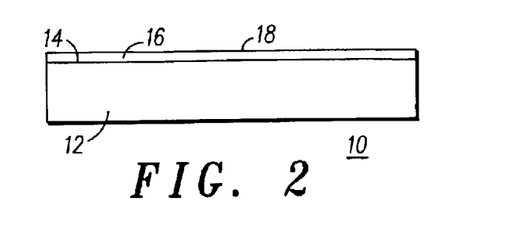

Referring now to FIG. 2, illustrated is substrate 12, having deposited thereon surface 14, an etch stop layer 16. The inclusion of etch stop layer 16 provides for contrast enhancement and improved inspection capabilities due to the presence of different reflection properties, indexes of refraction, and/or atomic number between etch stop layer 16 and the patterned relief layer (discussed presently). Etch stop layer 16 is disclosed as being formed of either an opaque or transparent material, dependent upon overall design objective, and the deposition of subsequent layers. More specifically, it is disclosed that the specific type of material utilized will have bearing on the resulting process steps that must be undertaken to complete fabrication of template 10. Transparent materials that are disclosed as being suitable for the fabrication of etch stop layer 16 are silicon nitride ($Si_xN_y$), silicon oxide ($Si_xO_y$), chromium (Cr), chromium oxide ($Cr_xO_y$), chromium nitride ($Cr_xN_y$), aluminum oxide ($Al_xO_y$), aluminum nitride ($Al_xN_y$), indium-tin-oxide ($I_xSn_yO_z$), indium oxide ($In_xO_y$), tin oxide ($Sn_xO_y$), zinc oxide ($Zn_xO_y$), cadmium oxide ($Cd_xO_y$), copper aluminum oxide ($Cu_xAl_yO_z$), copper gallium oxide ($Cu_xGa_yO_z$), cadmium tin oxide ($Cd_xSn_yO_z$), or any other transparent, or semi-transparent material, and combinations thereof or the like, where x and y are positive numbers with values that indicate the relevant concentration of an element in the aforementioned compounds. In a preferred embodiment x has a range of 0.1–1.0 and y has a range of 0.1–1.0 and z is such that the sum of x, y, and z=1.0. As an example, stoichiometric aluminum oxide is $Al_2O_3$. However, those skilled in the art realize that non-stoichiometric aluminum oxide films can be deposited and will serve the same purpose as the stoichiometric film. Opaque materials that are disclosed as being suitable for the fabrication of etch stop layer 16 are chrome (Cr), or the like. Etch stop layer 16 is formed to assist subsequent patterning of the remaining layers. Etch stop layer 16 is disclosed as having a thickness dependent upon the etch selectivity to the patterning layer, as well as the charge conductivity of the material used. Specifically, etch stop layer 16 will need to have a sufficiently low etch rate relative to the patterning layer in order to overcome any microloading effects. In addition, etch stop layer 16 must have sufficient strength to survive the stresses associated with template manufacturing and subsequent handling during the fabrication of the semiconductor devices with the completed lithographic template. Etch stop layer 16 is therefore generally disclosed as having a thickness in a range of 1–1000 nm, and a preferred thickness of at least 5 nm. Etch stop layer 16 is formed having a surface 18, on surface 14 of substrate 12 by spin coating, sputtering, vapor deposition, or the like. Further information regarding the inclusion of etch stop layer can be found in pending U.S. patent application, bearing Ser. No. 10/022,489, filed Dec. 18, 2001, entitled "LITHOGRAPHIC TEMPLATE AND METHOD OF FORMATION AND USE", assigned to the same assignee, and incorporated herein by this reference.

Figure 3:
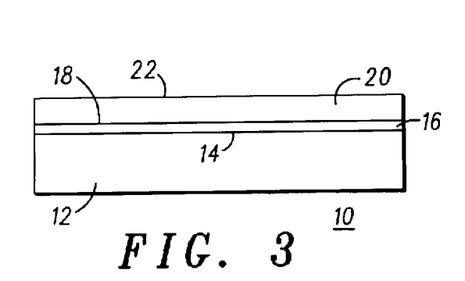

Referring now to FIG. 3, illustrated is substrate 12, having formed thereon etch stop layer 16. There is additionally formed on surface 18 of etch stop layer 16, a patterning layer 20. Patterning layer 20 is disclosed as being either imageable or directly imageable and formed of either an opaque or transparent material, dependent upon overall design objective, as well as the material comprising etch stop layer 16. A distinction between materials which are imageable and directly imageable must be drawn. Imageable materials include any material which may be patterned by means of convention lithographic techniques, including a masking layer and an etch or deposition layer, or combination thereof. Typically, with respect to imageable materials the masking layer is eliminated once imaging and pattern transfer into a second material is accomplished. Directly imageable materials include those materials which have the unique capability of being directly imaged through a lithographic method and are themselves useful once directly imaged for the intended purpose. The usefulness of a directly imageable material precludes its elimination subsequent to patterning.

It is disclosed that the specific type of material utilized for patterning layer 20 will have bearing on the resulting process steps that must be undertaken to complete fabrication of template 10. Patterning layer 20 is generally disclosed as being formed of a material having a different reflectivity (or index of refraction) or different atomic number than the material used for etch stop layer 16. This difference in atomic number will provide for improved inspectability properties, as described presently. Transparent materials that are disclosed as being suitable for the fabrication of patterning layer 20 are silicon dioxide ($Si_xO_y$), silicon nitride ($Si_xN_y$), silicon oxy-nitride ($Si_xO_yN_z$), indium-tin-oxide ($I_xSn_yO_z$), or the like. Opaque materials that are disclosed as being suitable for the fabrication of patterning layer 20 are tungsten (W), tungsten silicide ($W_xSi_y$), tungsten silicon nitride ($W_xSi_yN_z$), tungsten alloys, tantalum (Ta), tantalum silicide ($Ta_xSi_y$), tantalum silicon nitride ($Ta_xSi_yN_z$), tantalum alloys, titanium (Ti), titanium alloys, molybdenum (Mo), molybdenum silicide ($Mo_xSi_y$), molybdenum alloys, gold (Au), chrome (Cr), or the like. In addition, it is anticipated by this disclosure that patterning layer 20 can also be formed as a directly imageable patterning layer, comprised of an oxide material, such as hydrogen silsesquioxane (HSQ), marketed by Dow Corning as FOX-15® (discussed presently). In a preferred embodiment x has a range of 0.1–1.0 and y has a range of 0.1–1.0 and z is such that the sum of x, y, and z=1.0. In addition, patterning layer 20 could be formed of alternative directly imageable dielectric materials, such as a directly imageable nitride, or a directly imageable oxynitride. Further information on the fabrication of a directly imageable patterning layer formed of these types of materials can be found in pending U.S. patent application, bearing Ser. No. 10/022,489, filed Dec. 18, 2001, entitled "LITHOGRAPHIC TEMPLATE AND METHOD OF FORMATION AND USE", assigned to the same assignee and incorporated herein by this reference.

It should be noted that some patterning layers may not require an etch stop layer, since the substrate itself may perform sufficiently as an etch stop material. Patterning layer 20 may be used to assist charge dissipation during e-beam writing. In addition, patterning layer 20 aids in SEM-based template inspection due to the varying materials utilized in the plurality of layers. Patterning layer 20 is disclosed as generally having a thickness dependent upon the desired aspect ratio of the photocurable resist. Specifically, patterning layer 20 will need to have sufficient mechanical strength and durability to survive the stresses associated with template manufacturing and subsequent handling during the fabrication of the semiconductor devices with the completed lithographic template. Patterning layer 20 is therefore generally disclosed as having a thickness of between 10 and 5000 nm, and a preferred thickness of at least 50 nm. Patterning layer 20, having a surface 22, is formed on surface 18 of etch stop layer 16 by spin coating, sputtering, vapor deposition, or the like.

Figure 4:
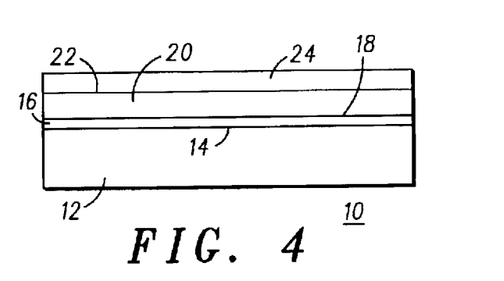
Figure 5:
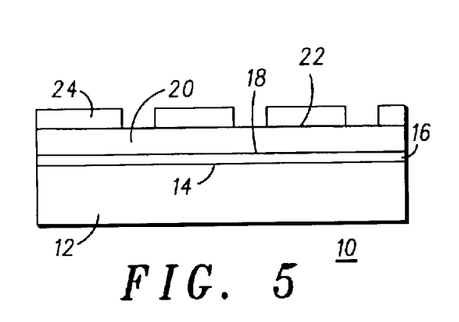

Referring now to FIGS. 4 and 5, illustrated is substrate 12, having formed thereon surface 14, etch stop layer 16 and patterning layer 20, formed on surface 18 of etch stop layer 16. Formed thereon surface 22 of patterning layer 20 is a resist layer 24, which is patterned as illustrated in FIG. 5 by standard optical or e-beam patterning techniques. Resist layer 24 is typically formed of a standard photoresist or electron-beam resist material well know in the art such as an organic polymer that is patterned so as to serve as a mask for the subsequent etching of patterning layer 20. It is additionally disclosed that anticipated by this disclosure is the optional inclusion of a hardmask layer (not shown), sandwiched between patterning layer 20 and resist layer 24. In the instance where a hard mask layer is included, it is anticipated that it would be formed of chrome (Cr), silicon dioxide ($Si_xO_y$), silicon oxy-nitride ($Si_xO_yN_z$), silicon nitride ($Si_xN_y$), or the like. In a preferred embodiment x has a range of 0.1–1.0 and y has a range of 0.1–1.0 and z is such that the sum of x, y, and z=1.0.

Figure 6:
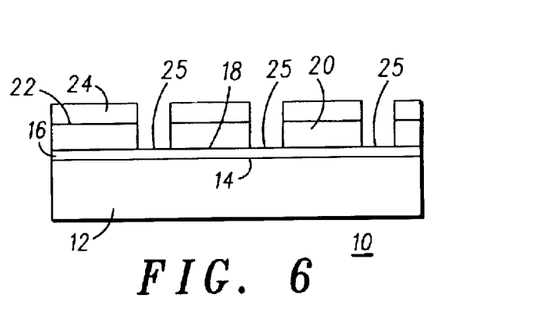

During fabrication, photoresist layer 24 serves as a mask for the etching therethrough of patterning layer 20. As illustrated in FIG. 6, patterning layer 20 is etched through to surface 18 of etch stop layer 16, thereby exposing portions 25 of etch stop layer 16. Etching of patterning layer 20 is accomplished through standard wet or dry etch techniques. Next, patterning layer 20 is overetched, if required, to provide for improved uniformity stopping against etch stop layer 16. Finally, to complete template 10, resist layer 24 is removed. In the instance where etch stop layer 16 is formed of an opaque material, removal of exposed portions 25 of etch stop layer 16 would need to be conducted to allow for the subsequent passage therethrough of radiation. Fabrication of template 10 in this manner to include an opaque etch stop layer 16 and patterning layer 20 provides for minimization of residual photopolymer where it is not desired, enhanced inspectability, compatibility with current template repair techniques, resistance to aggressive cleans, amorphous/low surface roughness material for desirable pattern transfer attributes and improved template contrast due to the varying material layers.

Figure 7:
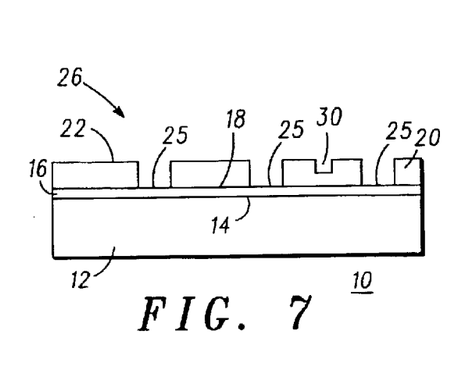

FIG. 7 illustrates in cross-sectional view, a completed lithographic template 10 including substrate 12 having surface 14, etch stop layer 16 overlying surface 14 of substrate 12, etch stop layer 16 having a surface 18, and patterning layer 20 overlying surface 18 of etch stop layer 16 and a gap defect 30. Upon completion, template 10 defines therein a relief structure 26, but defect 30 formed within relief structure 26 must be repaired prior to utilizing template 10 in any SFIL processing. Defect 30 is caused when there is an absence of relief material as illustrated in FIG. 7. Defect 30, prior to repair, is mapped using an optical or e-beam inspection system for exact location.

Figure 8:
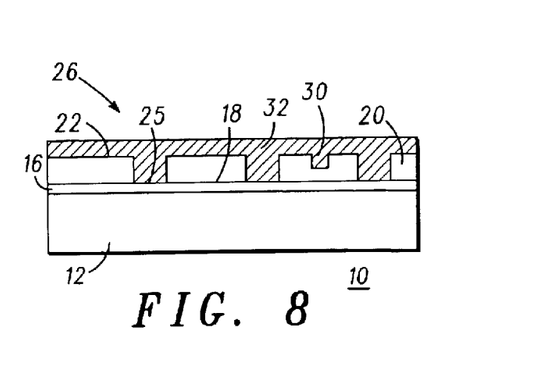

Referring now to FIG. 8, illustrated in cross-sectional view is a step in the method of repairing gap defect 30 in lithographic template 10. As illustrated, to repair gap defect 30, a layer of directly imageable oxide material 32 is deposited on the surface 22 of remaining portions of patterned layer 20, which define relief structure 26, filling in exposed portions 25, gap defect 30 and thereby substantially planarizing template 10. Directly imageable oxide material 32 in a preferred embodiment is formed of a material such as hydrogen silsesquioxane (HSQ), marketed by Dow Corning as FOX-15®. In addition, directly imageable oxide 32 could be formed of alternative directly imageable dielectric materials, such as a directly imageable nitride, or a directly imageable oxynitride. During template fabrication, directly imageable oxide material 32 is formed on surface 22 of remaining portions of patterned layer 20, filling in exposed portions 25, and gap defect 30 and then baked at a low temperature, such as approximately 200° C., to remove any solvents present.

Figure 9:
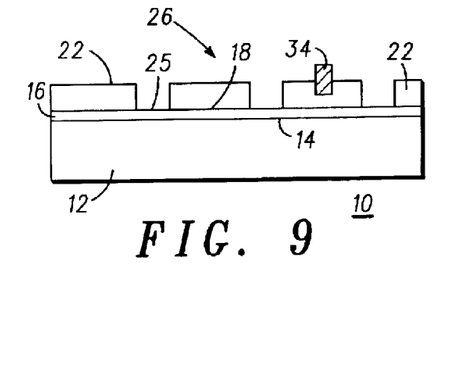

Subsequent to the baking of directly imageable oxide material 32, template 10 is exposed by standard optical or e-beam patterning techniques, to pattern previously mapped defect 30, thereby leaving an imaged oxide 34 formed in gap defect 30, as illustrated in FIG. 9. It is anticipated by this disclosure that exposure of directly imageable oxide material 32 can be accomplished utilizing e-beam radiation, x-ray radiation, ultraviolet radiation, deep ultraviolet radiation, ion beam radiation, or any other suitable radiation that provides for the exposure of directly imageable oxide material 32 to fill gap defect 30. Next, any remaining directly imageable oxide material 32 which lies outside of the region to be repaired is removed in a developing solution which is formulated to dissolve and remove either exposed or unexposed areas of the material. Directly imageable oxide material 32 utilized to repair defect 30 is formulated to react to irradiation by undergoing structural changes which inhibit dissolution in a developer within gap defect 30.

Figure 10:
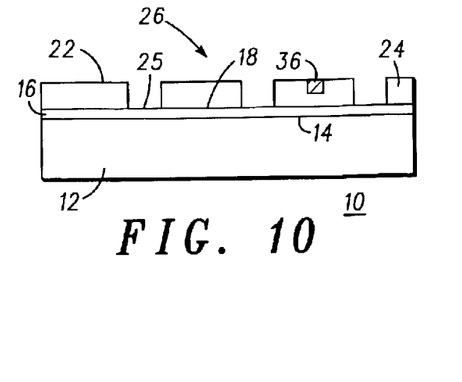

Finally, any remaining imaged directly imageable oxide 34 that remains present extraneous to the repaired defect is trimmed back, or removed, using a laser or focused ion beam (FIB), resulting in a repaired gap defect 36 within relief structure 26 as illustrated in FIG. 10. Accordingly, FIG. 10 illustrates in cross-sectional view, completed lithographic template 10 including substrate 12 having surface 14 and patterned relief layer 24 overlying surface 18 of etch stop 16, having a repaired defect 36 formed therein. Upon completion, template 10 defines therein relief structure 26.

In addition, while it is disclosed herein that template 10 is a single tiered structure, it is anticipated by this disclosure that template 10 can be formed as a multi-tiered structure having a gap defect present therein. Further information on the fabrication of a multi-tiered lithographic template can be found in pending U.S. patent application, bearing Ser. No. 10/081,199, filed Feb. 22, 2002, entitled "METHOD OF FABRICATING A TIERED STRUCTURE USING A MULTI-LAYERED RESIST STACK AND USE", assigned to the same assignee and incorporated herein by this reference.

Figure 11:
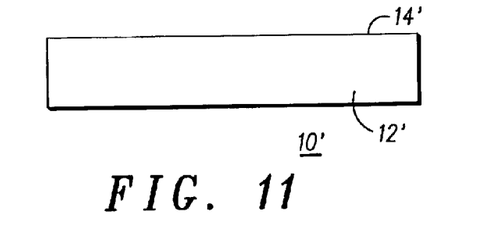
FIGS. 11–15 illustrate in cross-section views, process steps for fabricating a second embodiment of a lithographic template in accordance with the present invention.

Referring to FIGS. 11–15, illustrated in cross-sectional views, are a plurality of process steps for fabricating a second embodiment of a lithographic template according to the present invention. It should be noted that all components of FIGS. 11–15 that are similar to the components illustrated in FIGS. 1–10, are designated with similar numbers, having a prime added to indicate the different embodiment. Referring now to FIG. 11, illustrated is a first step in the process of fabricating a lithographic template 10' according to the present invention. Illustrated is a substrate 12', having a surface 14'. Substrate 12' is disclosed as being comprised of a transparent or semi-transparent material, such as a quartz material, a polycarbonate material, a pyrex material, a calcium fluoride ($CaF_2$) material, a magnesium fluoride material ($MgF_2$), or any other similar type of material, that is transparent or semi-transparent to light.

Figure 12:
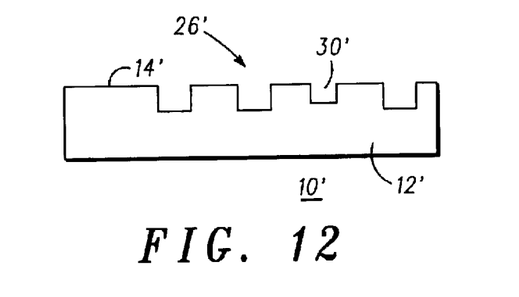

Next, substrate 12' has formed therein directly in surface 14', a relief structure 26'. Relief structure 26' is formed therein surface 14' using standard lithographic techniques previously described with respect to the first embodiment described in FIGS. 1–10, including photoresist and etch processing, or photoresist and etch processing including a hard mask. Accordingly, illustrated in cross-sectional view in FIG. 12 is completed lithographic template 10' including substrate 12' having surface 14' with relief structure 26' formed therein, including a gap defect 30' which must be repaired prior to utilizing template 10' in any SFIL processing. Defect 30' is caused when there is an absence of relief material as illustrated in FIG. 12. Defect 30', prior to repair, is mapped using an optical or e-beam inspection system for exact location.

Figures 13, 14:
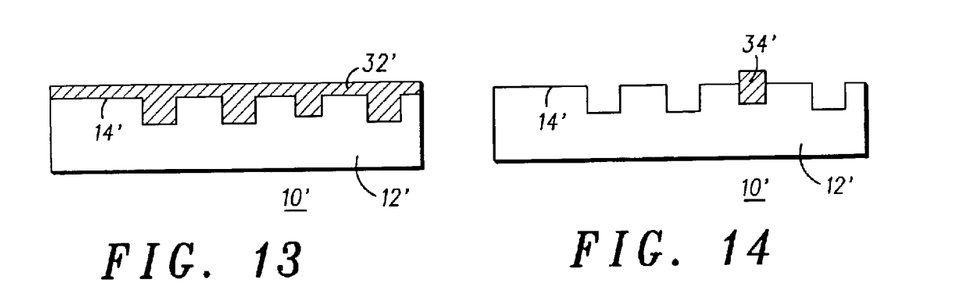

Referring now to FIG. 13, illustrated in cross-sectional view is a step in the method of repairing gap defect 30' in lithographic template 10'. Defect 30' is repaired in the same manner in which defect 30 of FIGS. 1–10 was repaired, as previously described. More specifically, to repair gap defect 30', a layer of directly imageable oxide material 32' is deposited on relief structure 26' and within gap defect 30', thereby substantially planarizing template 10'. Directly imageable oxide material 32' in a preferred embodiment is formed of a material such as hydrogen silsesquioxane (HSQ), marketed by Dow Corning as FOX-15®. In addition, directly imageable oxide 32' could be formed of alternative directly imageable dielectric materials, such as a directly imageable nitride, or a directly imageable oxynitride. Next, directly imageable oxide material 32' formed on relief structure 26' and within gap defect 30', is baked at a low temperature, such as approximately 200° C., to remove any solvents present.

Subsequent to the baking of directly imageable oxide material 32', template 10' is exposed by standard optical or e-beam patterning techniques, to pattern previously mapped defect 30', thereby leaving an imaged oxide 34' filling gap defect 30', as illustrated in FIG. 14. It is anticipated by this disclosure that exposure of directly imageable oxide material 32' can be accomplished utilizing e-beam radiation, x-ray radiation, ultraviolet radiation, deep ultraviolet radiation, ion beam radiation, or any other suitable radiation that provides for the exposure of directly imageable oxide material 32' to fill gap defect 30' Next, any remaining directly imageable oxide material 32' which lies outside of the region to be repaired is removed in a developing solution which is formulated to dissolve and remove either exposed or unexposed areas of the material. Directly imageable oxide material 32' utilized to repair defect 30' is formulated to react to irradiation by undergoing structural changes which inhibit dissolution in a developer within gap defect 30'.

Figure 15:
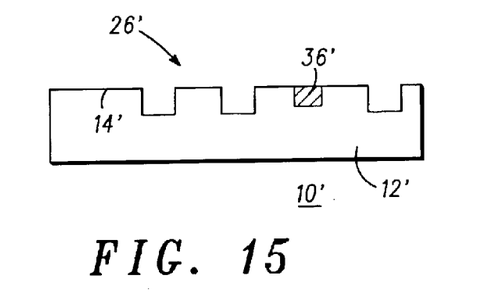

Finally, any remaining imaged directly imageable oxide 34' that remains present extraneous to the repaired defect is trimmed back, or removed, using a laser or focused ion beam (FIB), or the like, resulting in a repaired gap defect 36' within relief structure 26' as illustrated in FIG. 15. Accordingly, FIG. 15 illustrates in cross-sectional view, completed lithographic template 10' including substrate 12' having surface 14' and relief structure 26', and having a repaired defect 36' formed therein.

Figure 16:
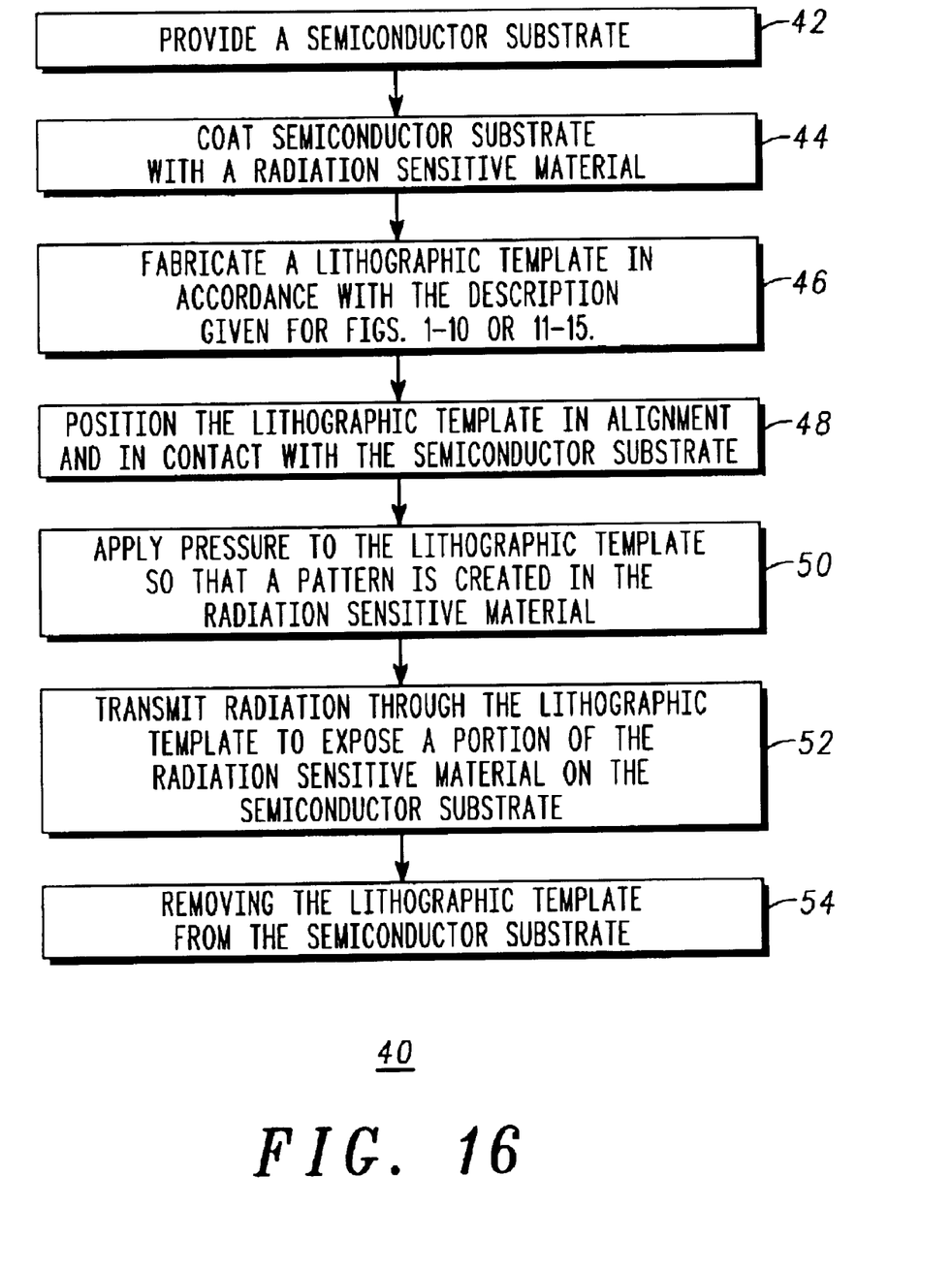
FIG. 16 is a simplified process flow diagram fabricating a semiconductor device with a lithographic template in accordance with the present invention.

Illustrated in FIG. 16 is a process flow diagram wherein a lithographic template, generally similar to template 10 of FIGS. 1–10 or 10' of FIGS. 11–15, fabricated in accordance with the present invention is used to fabricate a semiconductor device 40. Initially, a semiconductor substrate 42 is provided. Semiconductor substrate is then coated 44 with a radiation sensitive material, such as a photocurable organic layer or a photoresist layer. The semiconductor substrate may have overlying devices or device layer such as polysilicon, oxide, metal, etc., as well as trench and diffusion regions or the like. A lithographic template is fabricated 46 in accordance with the description given for FIGS. 1–10 or FIGS. 11–15. The radiation sensitive material layer coated semiconductor substrate is then placed adjacent 48 the lithographic template. A slight pressure is applied 50 to the template so that the radiation sensitive material layer flows into the relief structures on the template. Ultraviolet, deep ultraviolet, or broad band radiation is then transmitted 52 through the lithographic template, including the substrate, the etch stop layer and the patterning layer (for the cases when the patterning layer is transparent), and imaged onto the radiation sensitive material layer coated semiconductor substrate to further define and expose a pattern in the radiation sensitive material layer. The template is thereafter removed 54 from the semiconductor device, thereby leaving a patterned organic layer which is then used as an image layer for subsequent processing. The photoresist layer can then be used for several purposes related to masking including: (i) as a mask for ion implantation; (ii) as a mask for wet or dry etching into the substrate or adjacent layers; (iii) as a mask for material deposition such as with metal lift off processing; or (iv) any other process which requires a patterned mask. It should be understood that although the template fabricated in accordance with the present invention is described in the preferred embodiment as being used to fabricate a semiconductor device, that anticipated is the use of a template, generally similar to template 10 of FIGS. 1–10, to form microelectronic devices, micro electro mechanical devices, photonic, optoelectronic, and microfluidic devices.

The foregoing description and illustrations contained herein demonstrate many of the advantages associated with the present invention. In particular, the present invention provides for repair of defect formed within the patterned relief structure of the lithographic template.

Thus it is apparent that there has been provided, in accordance with the invention, a lithographic template having a repaired defect, the method of repairing the defect, and use of the lithographic template in SFIL processing that fully meets the need and advantages set forth previously. Although the invention has been described and illustrated with reference to specific embodiment thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method of forming a lithographic template comprising the steps of:

providing a lithographic template having an uppermost surface and having formed therein the uppermost surface a relief structure and at least one gap defect in the relief structure;

providing a directly imageable oxide material on the relief structure of the lithographic template and within the gap defect;

imaging the directly imageable oxide material, thereby forming a layer of imaged oxide within the gap defect; and removing any excess directly imageable oxide material from the relief structure of the lithographic template, wherein at least part of the imaged oxide layer remains in the gap defect after it has been repaired.

2. A method of forming a lithographic template as claimed in claim 1 further including the step of trimming back excess imaged oxide extraneous to the gap defect, thereby resulting in a complete lithographic template having a repaired gap defect.

3. A method of forming a lithographic template as claimed in claim 2, wherein the step of providing a lithographic template is further characterized as providing a substrate material comprised of one of a quartz material, a polycarbonate material, a calcium fluoride (CaF2) material, a magnesium fluoride (MgF2) material, or a pyrex material.

4. A method of forming a lithographic template as claimed in claim 3 wherein the lithographic template is formed of a single homogeneous substrate material having the relief structure formed therein an uppermost surface of the substrate material.

5. A method of forming a lithographic template as claimed in claim 2 wherein the lithographic template is comprised of a plurality of layers having the relief structure formed therein an uppermost surface of an uppermost layer.

6. A method of forming a lithographic template as claimed in claim 5 wherein the plurality of layers includes a substrate layer and a patterning layer, the relief structure formed therein an uppermost surface of the patterning layer.

7. A method for forming a lithographic template as claimed in claim 2 wherein the step of providing a directly imageable oxide material on the relief structure of the lithographic structure and within the gap defect includes providing a directly imageable transparent dielectric.

8. A method of forming a lithographic template as claimed in claim 7 wherein the directly imageable transparent dielectric is hydrogen silsesquioxane (HSQ).

9. A method of forming a lithographic template as claimed in claim 7 wherein the directly imageable transparent dielectric is an imageable nitride.

10. A method of forming a lithographic template as claimed in claim 7 wherein the directly imageable transparent dielectric is an imageable oxynitride.

11. A method for forming a lithographic template as claimed in claim 1 wherein the step of imaging the directly imageable oxide material includes imaging the directly imageable oxide material with one of an electron beam, an x-ray radiation, an ultraviolet radiation, a deep ultraviolet radiation, or an ion beam radiation.

12. A method for forming a lithographic template as claimed in claim 7 wherein the step of trimming back excess imaged oxide present extraneous to the gap defect includes removing the excess imaged oxide material using a laser or focused ion beam (FIB).

13. A method of forming a lithographic template comprising the steps of:
provide a substrate, the substrate having an uppermost surface;
providing a patterning layer supported by the substrate;
patterning the patterning layer thereby forming a patterned relief layer having a relief structure and at least one gap defect present in the patterned relief layer;
providing a directly imageable oxide material on the patterned relief layer and within the gap defect;
imaging the directly imageable oxide material, thereby forming a layer of imaged oxide within the gap defect; and
removing any excess directly imageable oxide material from the patterned relief layer, wherein at least part of the imaged oxide layer remains in the gap defect after it has been repaired.

14. A method of forming a lithographic template as claimed in claim 13 further including the step of trimming back excess imaged oxide present extraneous to the gap defect, thereby resulting in a complete lithographic template having a repaired gap defect.

15. A method of forming a lithographic template as claimed in claim 13, wherein the step of providing a substrate is further characterized as providing a substrate of one of a quartz material, a polycarbonate material, a calcium fluoride (CaF2) material, a magnesium fluoride (MgF2) material, or a pyrex material.

16. A method for forming a lithographic template as claimed in claim 13 further including the step of forming an etch stop layer between the surface of the substrate and the patterning layer.

17. A method for forming a lithographic template as claimed in claim 13, wherein the step of forming a patterning layer includes forming a patterned resist layer on the surface of the patterning layer, etching the patterning layer, thereby defining an etched patterning layer, and removing the patterned resist layer.

18. A method for forming a lithographic template as claimed in claim 13, wherein the step of forming a patterning layer is further characterized as forming a patterning layer of one of an opaque material or a transparent material.

19. A method for forming a lithographic template as claimed in claim 13 wherein the step of providing a directly imageable oxide material on the patterned relief layer and within the gap defect includes providing a directly imageable transparent dielectric.

20. A method of forming a lithographic template as claimed in claim 19 wherein the directly imageable transparent dielectric is hydrogen silsesquioxane (HSQ).

21. A method of forming a lithographic template as claimed in claim 19 wherein the directly imageable transparent dielectric is an imageable nitride.

22. A method of forming a lithographic template as claimed in claim 19 wherein the directly imageable transparent dielectric is an imageable oxynitride.

23. A method for forming a lithographic template as claimed in claim 13 wherein the step of patterning the directly imageable oxide material includes patterning the directly imageable oxide with one of an electron beam, an x-ray radiation, an ultraviolet radiation, a deep ultraviolet radiation, or an ion beam radiation.

24. A method for forming a lithographic template as claimed in claim 13 wherein the step of trimming back excess imaged oxide present extraneous to the gap defect includes removing the excess imaged oxide material using a laser or focused ion beam (FIB).

25. A lithographic template comprising:
a lithographic template having a surface;
a relief structure formed therein the surface of the lithographic template; and
a repaired gap defect formed therein the relief structure.

26. A lithographic template as claimed in claim 25 wherein the lithographic template includes a substrate formed of one of a quartz material, a polycarbonate material, a calcium fluoride (CaF2) material, a magnesium fluoride (MgF2) material, or a pyrex material.

27. A lithographic template as claimed in claim 26 wherein the lithographic template is comprised of the substrate material, having the relief structure formed therein an uppermost surface of the substrate material.

28. A lithographic template as claimed in claim 26 wherein the lithographic template is comprised of the substrate material and a patterning layer, the relief structure formed therein an uppermost surface of the patterning layer.

29. A lithographic template as claimed in claim 28 further including an etch stop layer formed on the surface of the substrate, the etch stop layer formed between the substrate and the patterning layer.

30. A lithographic template as claimed in claim 26 wherein the repaired gap defect is filled with an imaged, directly imageable oxide material.

31. A lithographic template as claimed in claim 30 wherein the directly imageable oxide material is hydrogen silsesquioxane (HSQ).

32. A lithographic template as claimed in claim 30 wherein the directly imageable oxide material is a directly imageable nitride.

33. A lithographic template as claimed in claim 30 wherein the directly imageable oxide material is a directly imageable oxynitride.

34. A method for making a device comprising the steps of:
providing a substrate;
coating the substrate with a radiation sensitive material layer;
fabricating a lithographic template; wherein the lithographic template comprises;
a lithographic template having a surface;
a relief structure formed therein the surface of the lithographic template; and
a repaired gap defect formed therein the relief structure;
positioning the lithographic template in contact with the radiation sensitive material layer, the radiation sensitive material layer being between the template and the substrate;
applying pressure to the template, the radiation sensitive material thereby flowing into the relief pattern on the template;
photoilluminating the lithographic template to expose at least a portion of the radiation sensitive material layer on the substrate, thereby further affecting the pattern in the radiation sensitive material layer; and
removing the template from the substrate.

35. A method for making a device as claimed in claim 34 wherein the repaired gap defect is filled by an imaged, directly imageable oxide material.

36. A method for making a device as claimed in claim 35 wherein the directly imageable oxide material is hydrogen silsesquioxane (HSQ).

37. A lithographic template as claimed in claim 35 wherein the directly imageable oxide material is a directly imageable nitride.

38. A method for making a device as claimed in claim 35 wherein the directly imageable oxide material is a directly imageable oxynitride.

39. A method for making a device as claimed in claim 35 wherein the step of photoilluminating the lithographic template is further characterized as transmitting one of ultraviolet light, deep ultraviolet light, or broad band light through the lithographic template.

40. A method for making a device as claimed in claim 35 wherein the radiation sensitive material layer is further characterized as coating the substrate with a photocurable material layer.

41. A method for making a device as claimed in claim 35 wherein the device is one of a semiconductor device, a microelectronic device, a micro electro mechanical device, optoelectronic, photonic, or a microfluidic device.

* * * * *